US006953942B1

(12) United States Patent
Graf et al.

(10) Patent No.: US 6,953,942 B1
(45) Date of Patent: Oct. 11, 2005

(54) ION BEAM UTILIZATION DURING SCANNED ION IMPLANTATION

(75) Inventors: Michael A. Graf, Belmont, MA (US); Andrew M. Ray, Newburyport, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 29 days.

(21) Appl. No.: 10/944,989

(22) Filed: Sep. 20, 2004

(51) Int. Cl.[7] .............................................. H01J 37/302
(52) U.S. Cl. ............................. 250/492.21; 250/442.11
(58) Field of Search ....................... 250/492.21, 442.11

(56) References Cited

U.S. PATENT DOCUMENTS

| | | | | |
|---|---|---|---|---|
| 4,736,107 A * | 4/1988 | Myron | .................... | 250/492.2 |
| 6,429,442 B1 | 8/2002 | Tomita et al. | | |
| 6,580,083 B2 | 6/2003 | Berrian | | |
| 2004/0058513 A1 | 3/2004 | Murrell et al. | | |

FOREIGN PATENT DOCUMENTS

WO WO 2004/001789 A2 12/2003

* cited by examiner

*Primary Examiner*—Kiet T. Nguyen
(74) *Attorney, Agent, or Firm*—Eschweiler & Associates, LLC

(57) ABSTRACT

The present invention is directed to implanting ions in a workpiece in a serial implantation process in a manner that produces a scan pattern that resembles the size, shape and/or other dimensional aspects of the workpiece. This improves efficiency and yield as an ion beam that the workpiece is oscillated through does not significantly "overshoot" the workpiece. The scan pattern may be slightly larger than the workpiece, however, so that inertial effects associated with changes in direction, velocity and/or acceleration of the workpiece as the workpiece reverses direction in oscillating back and forth are accounted for within a small amount of "overshoot". This facilitates moving the workpiece through the ion beam at a relatively constant velocity which in turn facilitates substantially more uniform ion implantation.

20 Claims, 12 Drawing Sheets

ION BEAM UTILIZATION DURING SCANNED ION IMPLANTATION

FIELD OF THE INVENTION

The present invention relates generally to semiconductor processing systems, and more particularly to controlling motion of a substrate relative to an ion beam during ion implantation.

BACKGROUND OF THE INVENTION

In the semiconductor industry, various manufacturing processes are typically carried out on a substrate (e.g., a semiconductor workpiece) in order to achieve various results on the substrate. Processes such as ion implantation, for example, can be performed in order to obtain a particular characteristic on or within the substrate, such as limiting a diffusivity of a dielectric layer on the substrate by implanting a specific type of ion. Conventionally, ion implantation processes are performed in either a batch process, wherein multiple substrates are processed simultaneously, or in a serial process, wherein a single substrate is individually processed. Traditional high-energy or high-current batch ion implanters, for example, are operable to achieve a short ion beam line, wherein a large number of workpieces may be placed on a wheel or disk, and the wheel is simultaneously spun and radially translated through the ion beam, thus exposing all of the substrates surface area to the beam at various times throughout the process. Processing batches of substrates in such a manner, however, generally makes the ion implanter substantially large in size.

In a typical serial implantation process, on the other hand, an ion beam is gene rally scanned back and forth across the workpiece multiple times. To facilitate implanting all of the workpiece with ions, the length of the scan path generally exceeds the diameter of the workpiece (e.g., so that edge portions of the workpiece also receive a uniform doping). However, since the workpiece is generally round (except where alignment notches may be located, for example), it can be appreciated that the beam "overshoots" or does not impinge upon the workpiece or substrate for substantial periods of time (e.g., where the beam is not scanning across the widest portion of the workpiece). This reduces throughput and wastes resources. Accordingly, it would be desirable to implant ions into a workpiece in a serial process in a manner that mitigates overshoot and thereby facilitates improved efficiency.

SUMMARY OF THE INVENTION

The present invention overcomes limitations of the prior art. Consequently, the following presents a simplified summary of the invention in order to provide a basic understanding of some aspects of the invention. This summary is not an extensive overview of the invention. It is intended to neither identify key or critical elements of the invention nor delineate the scope of the invention. Rather, its primary purpose is merely to present one or more concepts of the invention in a simplified form as a prelude to the more detailed description that is presented later.

The present invention is directed to a serial implantation process for implanting ions into a workpiece in a manner that conserves resources and improves throughput or yield. The workpiece is moved back and forth through a substantially fixed ion beam in a controlled manner to mitigate "overshoot". More particularly, the workpiece is oscillated along a fast scan path while being moved along a substantially perpendicular slow scan path. A scan pattern generated by the selective movement of the workpiece approximates the shape of the workpiece such that the entire workpiece is implanted with ions. In this manner, overshoot is mitigated as respective scans along the fast scan path occur through respective ranges of motion that correspond to respective sizes of the workpiece being scanned during the respective oscillations along the fast scan path. The scan pattern may be slightly larger than the workpiece, however, so that inertial effects associated with changes in direction, velocity and/or acceleration of the workpiece are accounted for within respective "overshoots". This allows the workpiece to be moved through the substantially stationary ion beam at a relatively constant velocity which in turn facilitates substantially uniform ion implantation.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
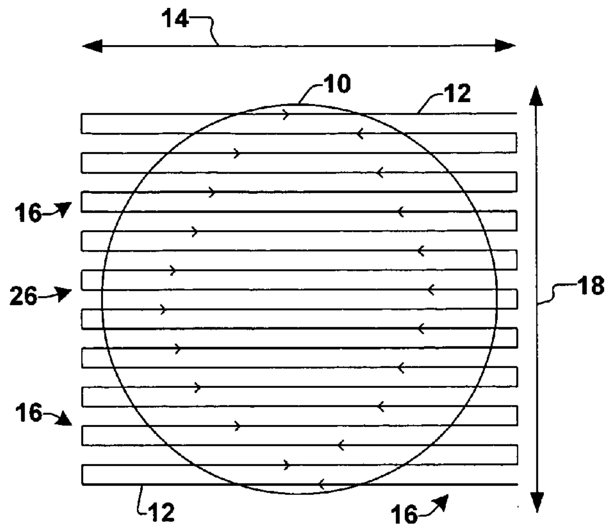
FIG. 1 is a top view illustration of a workpiece having a conventional scan pattern laid there-over.

The present invention is directed towards moving a workpiece or substrate relative to a substantially fixed ion beam so that a scan pattern produced thereby resembles the shape of the workpiece. One or more aspects of the present invention will now be described with reference to drawing figures, wherein like reference numerals are used to refer to like elements throughout. It should be understood that the drawing figures and following descriptions are merely illustrative and that they should not be taken in a limiting sense. In the following description, for purposes of explanation, numerous specific details are set forth in order to provide a thorough understanding of the present invention. It will be evident to one skilled in the art, however, that the present invention may be practiced without these specific details. Thus, it will be appreciated that variations of the illustrated systems and methods apart from those illustrated and described herein may exist and that such variations are deemed as falling within the scope of the present invention and the appended claims.

According to one or more aspects of the present invention, increased throughput is attained by selectively maneuvering a workpiece back and forth through a substantially stationary ion beam in a controlled manner. Such control is advantageously a function of the location of the workpiece relative to the ion beam. Scanning the workpiece in such a manner improves efficiency, at least, by mitigating unnecessary "overshoot". An advantage of the present invention may be appreciated by referring to the differences illustrated between prior art FIG. 1 and FIG. 2A, for example. In prior art FIG. 1, a workpiece 10 is depicted with an exemplary scan pattern 12 overlying the workpiece 10. The scan pattern 12 is created by scanning an ion beam back and forth along a first or "fast" scan path 14, where the fast scan path 14 corresponds to a widest portion 26 of the workpiece 10 plus some overshoot 16. The overshoot 16, in turn, corresponds to instances where the beam is scanned past the workpiece 10 and therefore no longer impinges on the workpiece 10. The beam is also moved along a second or "slow" scan path 18 as the beam oscillates along the first scan path 14. It can be appreciated that the scan pattern 12 is basically independent of the size and/or shape of the workpiece 10 in that only the widest portion 26 of the workpiece 10 is considered so that the scan pattern 12 is large enough to cover this widest portion 26 of the workpiece 10. As such, substantial overshoot 16 exists within the scan pattern 12, particularly at areas other than at the widest portion 26 of the workpiece 10.

Figure 2A:
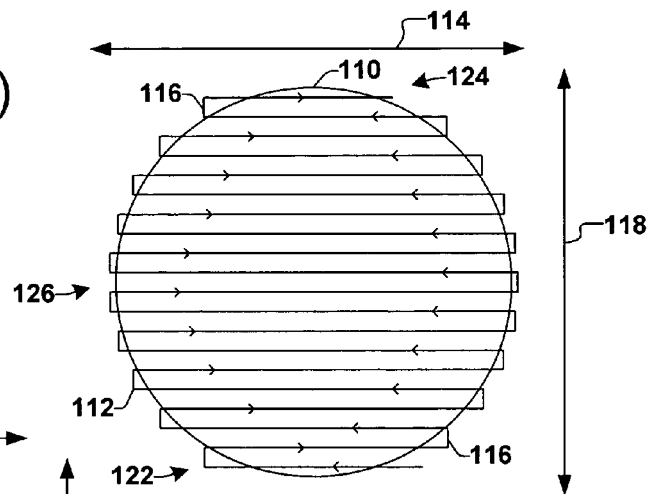
FIG. 2A is a top view illustration of a workpiece having a scan pattern laid there-over that may be developed by moving the workpiece through an ion beam in accordance with one or more aspects of the present invention whereby overshoot is substantially reduced.

As can be seen in FIG. 2A, however, one or more aspects of the present invention facilitate controlling the scanning of a workpiece 110 with respect to a substantially fixed ion beam (not shown) such that a scan pattern 112 developed thereby resembles the size and/or shape of the workpiece 110. More particularly, the workpiece 110 is controllably moved through respective ranges of motion along a first or fast scan path 114, where the ranges of motion correspond to respective sizes of the workpiece 110 being scanned during respective oscillations along the first scan path 114. In the illustrated example, the workpiece is also indexed one increment along a second or slow scan path 118 between respective oscillations along the first scan path 114. As such, overshoot 116 is significantly reduced in accordance with one or more aspects of the present invention.

Respective amounts of overshoot 116 are maintained according to one or more aspects of the present invention so that inertial effects experienced by the workpiece 110 as the workpiece 110 changes direction, velocity and/or acceleration (e.g., between respective oscillations along the first scan path 114 and/or while moving along the second scan path 118) are accommodated within the overshoots 116. It will be appreciated that any type of scanning system and/or control system associated therewith operable to effectuate such control over the movement of the workpiece 110 relative to the ion beam is contemplated as falling within the scope of the present invention. Dynamic control over the movement of the workpiece 110 according to one or more aspects of the present invention can be based upon a known orientation of the workpiece 110 relative to the ion beam, for example, as well as knowledge of one or more dimensional aspects (e.g., size, shape) of the workpiece 110 and/or ion beam. Similarly, beam detectors can be utilized (e.g., located somewhat behind the workpiece) to give an indication when the beam is no longer impinging upon the workpiece 110, and thus when an overshoot condition is occurring.

Figure 2B:
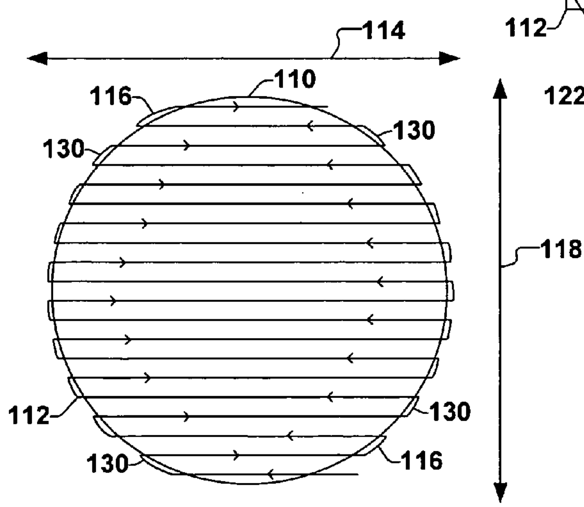
FIG. 2B is another top view illustration of a workpiece having a scan pattern laid there-over that may be developed by moving the workpiece through an ion beam in accordance with one or more aspects of the present invention whereby overshoot is reduced even further.

It will be appreciated that since workpieces are usually round, scanning generally begins on a narrowest portion 122 of the workpiece 110 and ends on an opposite narrowest portion 124 of the workpiece 110 with the widest portion 126 of the workpiece 110 scanned about half way in between. This is generally true unless less than all of the workpiece 110 (e.g., one half of the workpiece) is to be scanned and implanted, in which case the scanning may begin at a wider portion of the workpiece 110 and end at any other desirable location on the workpiece 110. As illustrated in FIG. 2B, it will also be appreciated that the workpiece 110 can be iteratively and incrementally moved along the first 114 and second 118 scan paths during respective overshoot periods so that "transitional" portions 130 of the scan pattern 112 during these overshoot periods more closely resemble the shape (e.g., perimeter curvature) of the workpiece 110. In this manner, the amount of overshoot is mitigated even further.

Figure 2C:
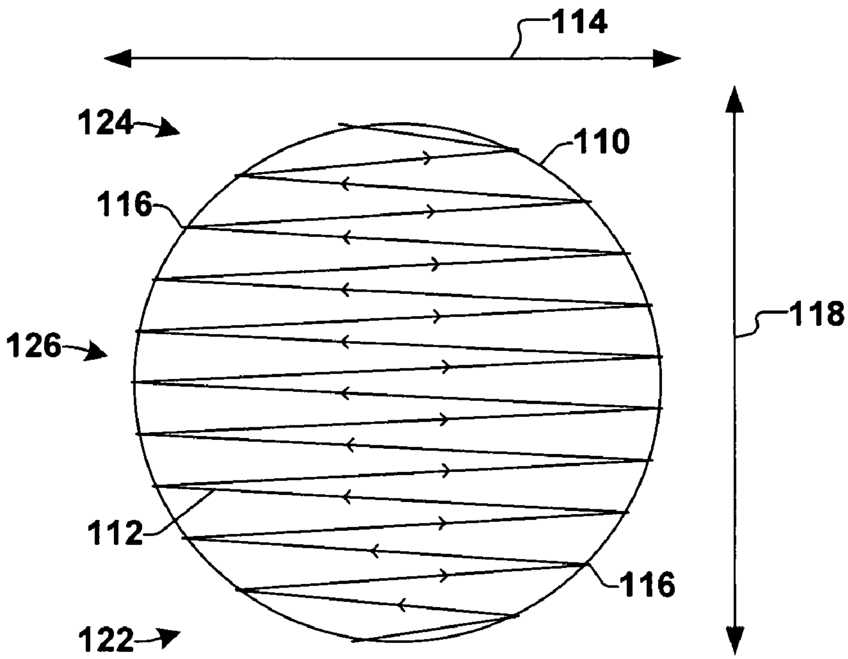
FIG. 2C is yet another top view illustration of a workpiece having a zig-zag scan pattern laid there-over that may be developed by moving the workpiece through an ion beam in accordance with one or more aspects of the present invention whereby overshoot is reduced.

It will also be appreciated that even though much of the discussion herein pertains to details regarding an example wherein the workpiece is indexed or incrementally moved along the slow scan path in between respective oscillations of the workpiece along the fast scan path, that one or more aspects of the present invention also contemplate continual movement of the workpiece along the slow scan path while the workpiece is oscillated along the fast scan path. FIG. 2C illustrates this situation whereby the scan pattern 112 appears to zig-zag across the workpiece 110, yet the scan pattern 112 still resembles the shape of the workpiece 110 by having reduced amounts of overshoot 116. In such an arrangement, since the workpiece is moved at a relatively constant velocity along the slow scan path 118, the frequency of oscillations along the fast scan path 114 is dynamically adjusted to maintain uniform ion implantation across the workpiece 110 (e.g., based upon orientation data regarding the relative orientation of the workpiece to the beam and dimensional data regarding the size and/or shape of the workpiece and/or ion beam.

Figure 2D:
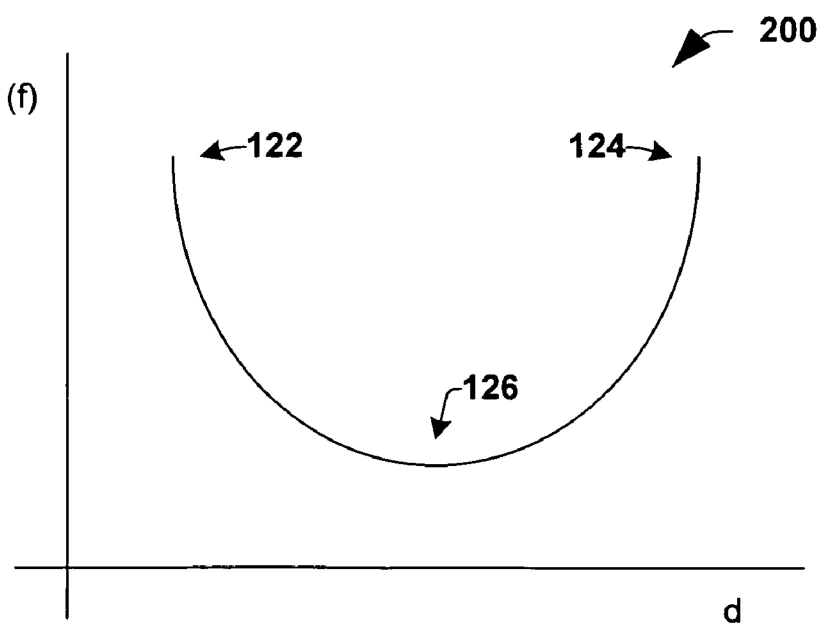
FIG. 2D is a plot of scan frequency versus distance scanned for producing a scan pattern, such as that depicted in FIG. 2C, according to one or more aspects of the present invention.

FIG. 2D is a graphical depiction illustrating a plot 200 of frequency (f) versus distance (d) traveled by the workpiece 110 along the fast scan path 114 where the speed of the workpiece 110 along the slow scan path 118 is maintained relatively constant. It can be seen that that the frequency of the workpiece 110 along the fast scan path 114 is highest at the beginning 122 and end 124 of scanning, and lowest at the middle 126 of scanning. This, of course, corresponds to the situation where the narrowest portion 122 of the workpiece 110 is scanned first, followed by the widest portion 126 of the workpiece and ending with the opposite narrowest portion 124 of the workpiece 110. It will also be appreciated that a combination of dynamically adjusting the respective speeds of the workpiece 100 along the slow 118 and fast 114 scan paths to obtain uniform ion implantation are contemplated according to one or more aspects of the present invention.

Figure 3:
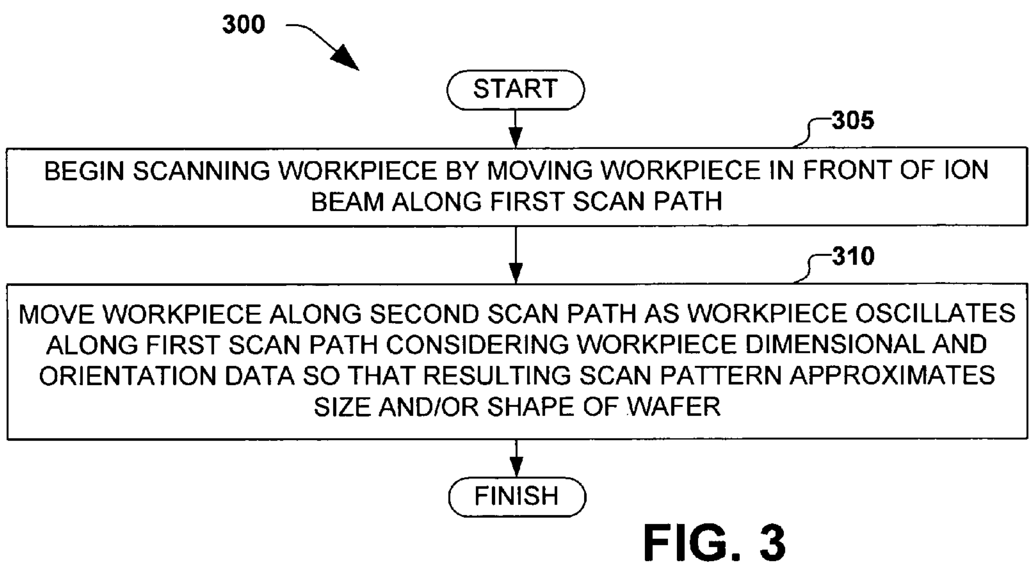
FIG. 3 is a flow diagram illustrating an exemplary methodology for scanning a workpiece through an ion beam in accordance with one or more aspects of the present invention.
Figure 4:
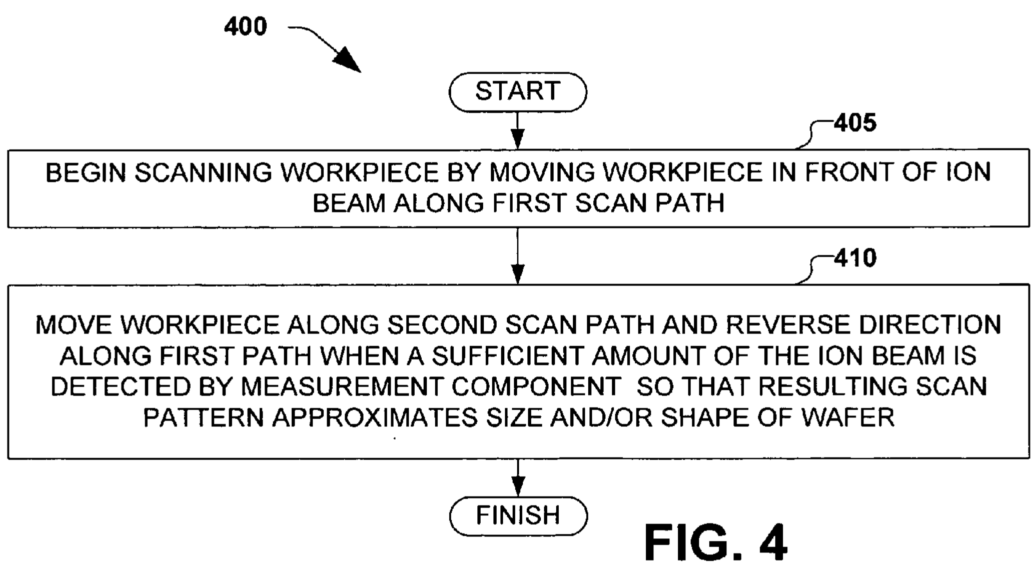
FIG. 4 is a flow diagram illustrating another exemplary methodology for scanning a workpiece through an ion beam according to one or more aspects of the present invention.

Turning to FIGS. 3 and 4, exemplary methodologies 300 and 400, respectively, are illustrated for implanting ions into a workpiece by scanning the workpiece through a beam of ions in accordance with one or more aspects of the present invention. Although the methodologies 300, 400 are illustrated and described hereinafter as a series of acts or events, it will be appreciated that the present invention is not limited by the illustrated ordering of such acts or events. For example, some acts may occur in different orders and/or concurrently with other acts or events apart from those illustrated and/or described herein. In addition, not all illustrated acts may be required to implement a methodology in accordance with one or more aspects of the present invention. Further, one or more of the acts may be carried out in one or more separate acts or phases. It will be appreciated that a methodology carried out according to one or more aspects of the present invention may be implemented in association with systems illustrated and described herein as well as in association with other systems not illustrated or described herein.

As illustrated in FIG. 3, the methodology 300 begins at 305 with beginning to move the workpiece along a first scan path such that the workpiece is scanned through the ion beam. Then, at 310 the workpiece is moved along a second scan path as the workpiece oscillates along the first scan path, wherein dimensional data regarding dimensions of the workpiece and/or the ion beam (e.g., a shape and/or cross-sectional area of the ion beam for use in determining just how much of the workpieces is actually implanted with ions when the beam impinges upon a portion of the workpiece), as well as orientation data regarding an orientation of the workpiece relative to the ion beam are utilized in producing an ion beam scan pattern across the workpiece that approximates the dimensions (e.g., size, shape) of the workpiece. The methodology ends thereafter. In one example, the workpiece is oscillated along the first scan path at a frequency of less than about ten hertz.

Similarly, the methodology 400 illustrated in FIG. 4 begins at 405 with moving the workpiece along a first scan path such that the workpiece is scanned through the ion beam. Then, at 410 the workpiece is moved along a second scan path as the workpiece oscillates along the first scan path, wherein a determination as to when to reverse the direction of the workpiece along the first scan path is based upon a sufficient amount of the ion beam being detected by a measurement component such that an ion beam scan pattern produced thereby approximates the dimensions of the workpiece. The methodology then ends. In one example, a full intensity of the ion beam corresponds to the amount of the ion beam sufficient to cause the workpiece to reverse directions.

Figure 5:
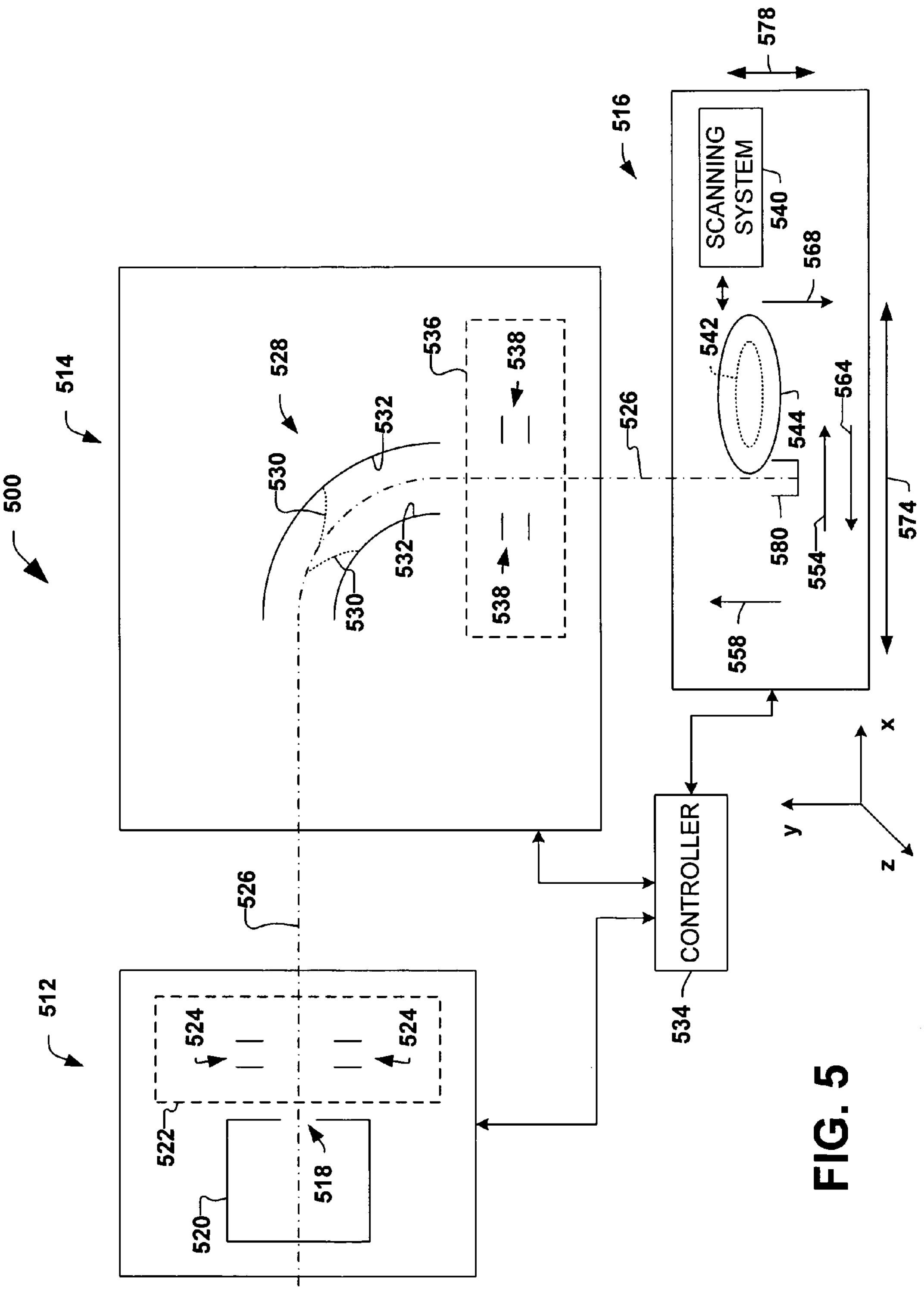
FIG. 5 is a schematic block diagram illustrating an exemplary ion implantation system suitable for implementing one or more aspects of the present invention.

FIG. 5 illustrates an exemplary ion implantation system 500 suitable for implementing one or more aspects of the present invention. The implantation system 500 includes an ion source 512, a beamline assembly 514, and a target or end station 516. The ion source 512 comprises an ion generation chamber 520 and an ion extraction (and/or suppression) assembly 522. A (plasma) gas of a dopant material (not shown) to be ionized is located within the generation chamber 520. The dopant gas can, for example, be fed into the chamber 520 from a gas source (not shown). Energy can be imparted to the dopant gas via a power source (not shown) to facilitate generating ions within the chamber 520. It will be appreciated that the ion source 512 can also utilize any number of suitable mechanisms (none of which are shown) to excite free electrons within the ion generation chamber 520, such as RF or microwave excitation sources, electron beam injection sources, electromagnetic sources and/or a cathode which creates an arc discharge within the chamber, for example. The excited electrons collide with the dopant gas molecules in the chamber 520 and ions are thereby generated. Generally positive ions are generated, although the present invention is applicable to systems wherein negative ions are generated by the source 512. The ions are controllably extracted through a slit 518 in the chamber 520 by the ion extraction assembly 522, which comprises a plurality of extraction and/or suppression electrodes 524. It will be appreciated that the extraction assembly 522 can include, for example, an extraction power supply (now shown) to bias the extraction and/or suppression electrodes 524 to accelerate the ions from the source 512 along a trajectory leading to an ion mass analyzing magnet 528 within the beamline assembly 514.

Accordingly, the ion extraction assembly 522 functions to extract a beam 526 of ions from the plasma chamber 520 and to accelerate the extracted ions into the beamline assembly 514, and more particularly into a mass analysis magnet 528 within the beamline assembly 514. The mass analysis magnet 528 is formed at about a ninety degree angle and a magnetic field is generated therein. As the beam 526 enters the magnet 528, it is correspondingly bent by the magnetic field such that ions of an inappropriate charge-to-mass ratio are rejected. More particularly, ions having too great or too small of a charge-to-mass ratio are deflected 530 into side walls 532 of the magnet 528. In this manner, the magnet 528 only allows those ions in the beam 526 which have the desired charge-to-mass ratio to completely traverse therethrough. Control electronics or a controller 534 can be included to adjust the strength and orientation of the magnetic field, among other things. The magnetic field can, for example, be controlled by regulating the amount of electrical current running through field windings of the magnet 528. It will be appreciated that the controller 534 may include a programmable micro-controller, processor and/or other type of computing mechanism for overall control of the system 500 (e.g., by an operator, previously and/or presently acquired data and/or programs).

The beamline assembly 514 may also include an accelerator 536, for example, that comprises a plurality of electrodes 538 arranged and biased to accelerate and/or decelerate ions, as well as to focus, bend and/or decontaminate the ion beam 526. Further, it will be appreciated that ion beam collisions with other particles degrade beam integrity so that the entire beamline assembly 514 from the source 512 to the end station 516, including the mass analysis magnet 528, may be evacuated by one or more pumps (not shown). Downstream of the accelerator 536 is the end station 516 which receives the mass analyzed ion beam 526 from the beamline assembly 514. The end station 516 includes a scanning system 540 that may comprise a support or end effector 542 upon which a workpiece 544 to be treated is mounted for selective movement thereby. The end effector 542 and workpiece 544 reside in a target plane that is generally perpendicular to the direction of the ion beam 526.

According to one or more aspects of the present invention, the workpiece 544 is moved (e.g., via the end effector 542) back and forth in directions 554, 564 along a first or "fast" scan path 574 (e.g., along the x-axis) such that respective ranges of motion of the workpiece 544 along the first scan path 574 during the respective oscillations of the workpiece 544 along the first scan path 574 correspond to respective sizes of portions of the workpiece 544 being scanned during the respective oscillations. The workpiece 544 is also moved through slow scan directions 558 or 568 along a second or "slow" scan path 578 (e.g., along the y-axis) as the workpiece 544 oscillates along the first scan path 574. In this manner, a scan pattern produced thereby approximates the shape of the workpiece 544. By way of example, in the system 500 illustrated in FIG. 5, the workpiece 544 has just completed a fast scan in direction 554, and is thus ready to be moved back through fast scan direction 564 (e.g., once the workpiece 544 has been indexed along the slow scan path 578).

The respective ranges of motion of the workpiece 544 along the first scan path 574 may be a function of the orientation of the workpiece 544 relative to the ion beam 526 as well as the size, shape and/or other dimensional data of the workpiece 544 and/or the ion beam, for example. The controller 534 may, for example, utilize such orientation data and dimensional data to control the selective movement of the workpiece 544. For example, the respective ranges of motion of the workpiece 544 along the fast scan path 574 may be controlled (e.g., by the controller 534) to slightly exceed the respective sizes of the portions of the workpiece 544 being scanned during the respective oscillations so that the workpiece 544 is not impinged upon by the ion beam while the workpiece is changing directions and/or moving along the second scan path 578. In this manner, respective overshoots can be said to exist for the different oscillations. Such overshoots can, for example, be made large enough to accommodate inertial effects that are inevitable when the workpiece 544 changes direction and/or velocity.

Accommodating such inertial effects "outside of" where the workpiece 544 intersects the ion beam 526 facilitates a more uniform ion implantation since the workpiece 544 is resultantly moving at a more constant velocity when it actually passes through the ion beam 526. Additionally, the end of a scan can, for example, be ascertained and/or anticipated by tracking (e.g., with the controller 534) the relative position of the workpiece 544 to the ion beam 526 (e.g., by knowing an initial orientation of the workpiece 544 to the ion beam 526, knowing the dimensions of the workpiece and/or ion beam and tracking the movements of the workpiece 544 (e.g., via the end effector 542) so as to maintain a constant "watch" over the relative position of the workpiece 544 to the beam 526). The workpiece 544 can thereafter be moved in the opposite direction back along fast scan path 574 once inertial effects have been accommodated.

A measurement component 580 (e.g., a Faraday cup) may also be incorporated into the end station 516. The measurement component 580 may be operative to detect beam current, for example, and may be situated behind the workpiece 544 (e.g., so as to not interfere with the ion implantation process). A detected level of beam current can, for example, be utilized to identify the end of a scan. For example, when the measurement component 580 detects a full intensity of the ion beam 526, it may provide the controller 534 with a signal indicating that the workpiece 544 has just completed a pass through the ion beam 526. Knowing the speed of the workpiece 544 and/or the incremental distance that the workpiece 544 has to travel along the second scan path 578, for example, the controller 534 can regulate the duration of respective overshoots to accommodate inertial effects. Similarly, one or more adjustments to the movement of the workpiece 544 can be made should the workpiece 544 begin to move back into the ion beam too quickly (e.g., where the workpiece is still being moved along the second scan path 578). In this instance, the measurement component may, for example, detect beam current sooner than expected. Such a situation could result in a perimeter or edge portion of the workpiece 544 becoming too heavily doped, for example. Further, the entire workpiece can be deemed to have passed through the ion beam and been implanted with ions when a full intensity of the ion beam continues to be detected by the measurement component 580 as the workpiece is oscillated back along the first scan path (e.g., indicating that the workpiece 544 has completely transitioned through the slow scan path 578).

It will be appreciated that the measurement component 580 can also be utilized to "map" ion implantation. For example, a Faraday cup can be substituted for the workpiece 580 during a test run. The Faraday cup can then be moved relative to the ion beam 526 while the beam current is held constant. In this manner, variations in ion dosage can be detected. A waveform or map of beam current intensity versus scan position can thus be identified (e.g., by feeding the readings taken by the cup back to the controller 534). The detected waveform(s) can then be utilized to adjust the beam current during actual implantation. Further, a source of plasma (not shown) may also be included in the end station 516 to bathe the beam 526 in neutralizing plasma to mitigate the number of positive charges that would otherwise accumulate on a target workpiece 544. A plasma shower would, for example, neutralize charges that would otherwise accumulate on a target workpiece 544 as a result of being implanted by the charged ion beam 526.

Figure 6:
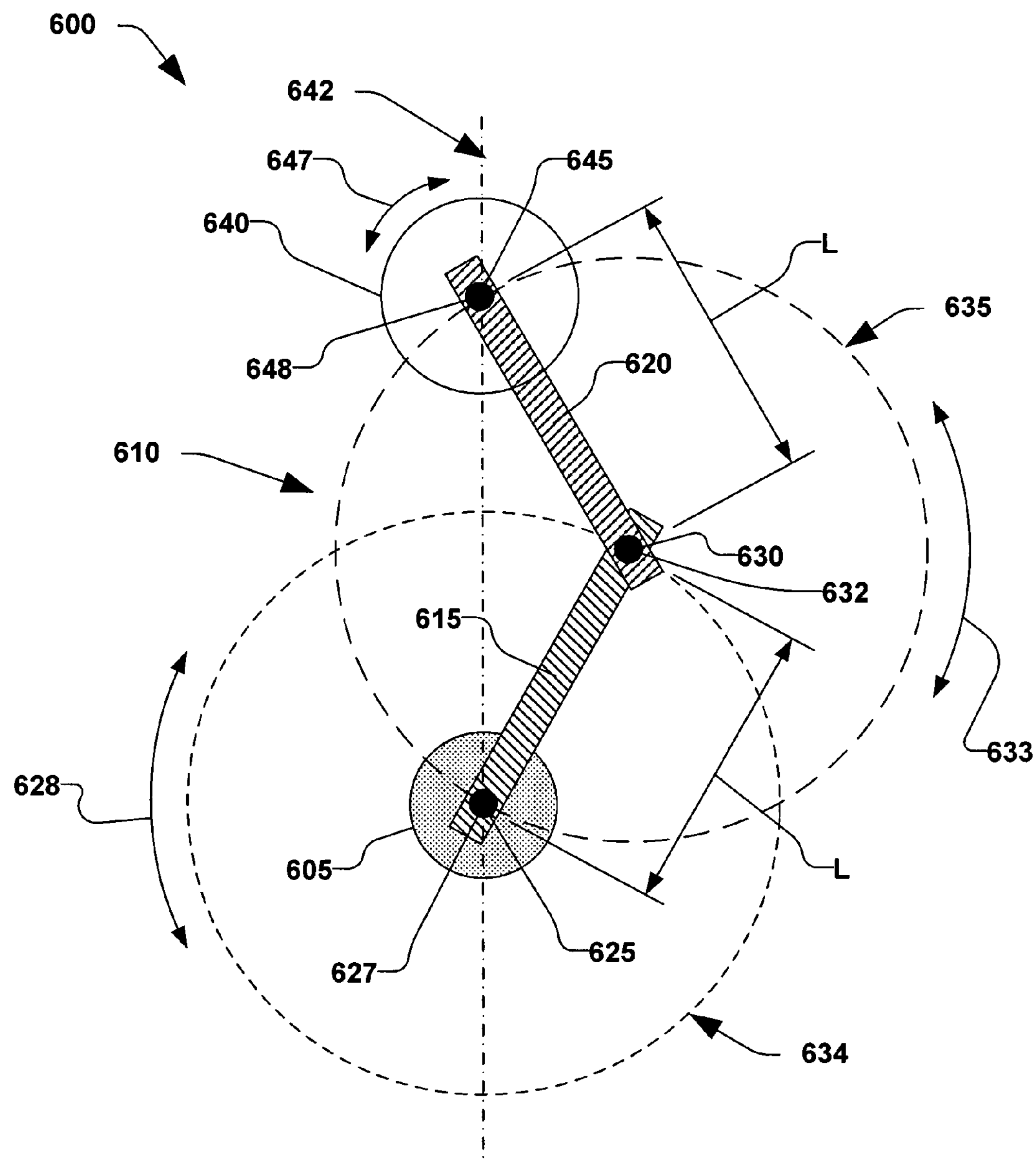
FIG. 6 is a plan view of an exemplary scanning apparatus suitable for implementing one ore more aspects of the present invention.

Turning now to FIG. 6, an exemplary scanning mechanism 600 suitable for implementing one or more aspects of the present invention is illustrated. The scanning mechanism 600 may, for example, be comprised within the scanning system 540 referred to in FIG. 5 for selectively maneuvering a workpiece relative to a stationary ion beam to facilitate implanting ions into the workpiece. The scanning mechanism 600 comprises a base portion 605 operably coupled to a rotary subsystem 610. The base portion 605 may, for example, be stationary with respect to the beam (not shown), or may be further operable to move with respect to the beam, as will be discussed hereafter. The rotary subsystem 610 comprises a first link 615 and a second link 620 associated therewith, wherein, for example, the rotary subsystem 610 is operable to linearly translate a substrate or workpiece (not shown) with respect to the base portion 605 via movement of the first link 615 and the second link 620.

In one example, the first link 615 is rotatably coupled to the base portion 605 via a first joint 625, wherein the first link 615 is operable to rotate about a first axis 627 in a first rotational direction 628 (e.g., the first link 615 is operable rotate clockwise or counter-clockwise with respect to the first joint 625). The second link 620 is further rotatably coupled to the first link 615 via a second joint 630, wherein the second joint 630 is spaced a predetermined distance L from the first joint 625. The second link 620 is further operable to rotate about a second axis 632 in a second rotational direction 633 (e.g., the second link 620 is operable to rotate clockwise or counter-clockwise with respect to the second joint 630). The first link 615 and the second link 620, for example, are further operable to rotate in separate, yet generally parallel first and second planes (not shown), respectively, wherein the first and second planes are generally perpendicular to the respective first and second axes 627 and 632.

The first link 615 and second link 620 are operable to, but need not, rotate 360 degrees in a respective first rotational path 634 and second rotational path 635 about the respective first joint 625 and second joint 630. The first rotational direction 628 is generally opposite the second rotational direction 633, however, wherein an end effector 640 associated with the second link 620 is operable to linearly translate along a first scan path 642 associated with the movement of the first link 615 and the second link 620. The end effector 640, for example, is operably coupled to the second link 620 via a third joint 645 associated with the second link 620, wherein the third joint 645 is spaced the predetermined distance L from the second joint 630. The third joint 645, for example, is operable to provide a rotation 647 of the end effector 640 about a third axis 648. Furthermore, according to another example, the third joint 645 may be operable to provide a tilt (not shown) of the end effector 640, wherein, in one example, the end effector 640 is operable to tilt about one or more axes (not shown) which are generally parallel to the second plane (not shown).

The end effector 640, for example, is further operable to secure the substrate (not shown) thereto, wherein the movement of the end effector 640 generally defines a movement of the substrate. The end effector 640, for example, may comprise an electrostatic chuck (ESC), wherein the ESC is operable to substantially clamp or maintain a particular position or orientation of the substrate with respect to the end effector 640. It should be noted that while an ESC is described as one example of the end effector 640, the end effector 640 may comprise various other devices for maintaining a grip of a payload (e.g., the substrate), and all such devices are contemplated as falling within the scope of the present invention.

The movement of the first link 615 and second link 620, for example, can be further controlled in order to linearly oscillate the end effector 640 along the first scan path 642, wherein the substrate (not shown) can be moved in a predetermined manner with respect to the ion beam (e.g., an ion beam coincident with the first axis 627). A rotation of the third joint 645, for example, can be further controlled, wherein the end effector 640 is maintained in a generally constant rotational relation with the first scan path 642. It should be noted that the predetermined distance L separating the first joint 625 and second joint 630, as well as the second joint 630 and third joint 645, provides a general congruity in link length when measured between the respective joints. Such a congruity in length of the first link 615 and second link 620 generally provides various kinematic advantages, such as a more constant velocity of end effector 640 along the first scan path 642, for example.

Figure 7A:
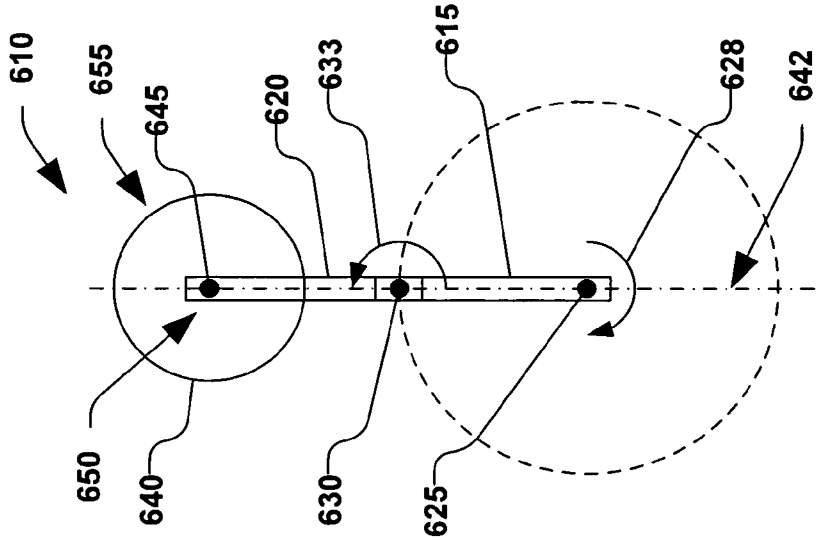
FIGS. 7A–7L are plan views of a rotary subsystem of the exemplary scanning apparatus of FIG. 6 at various operating positions.
Figure 7B:
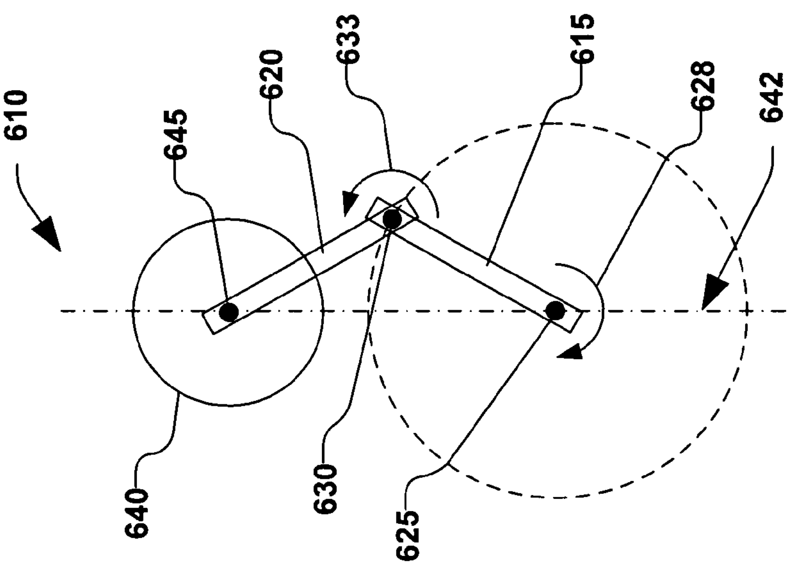
Figure 7C:
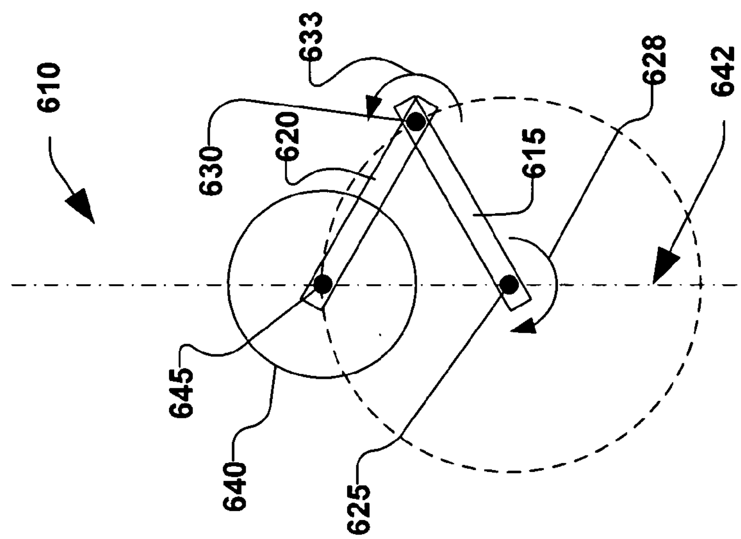
Figure 7F:
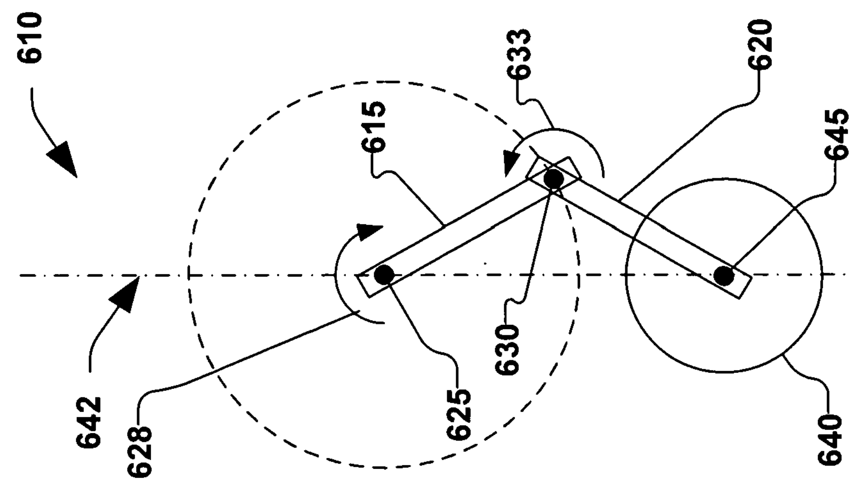
Figure 7E:
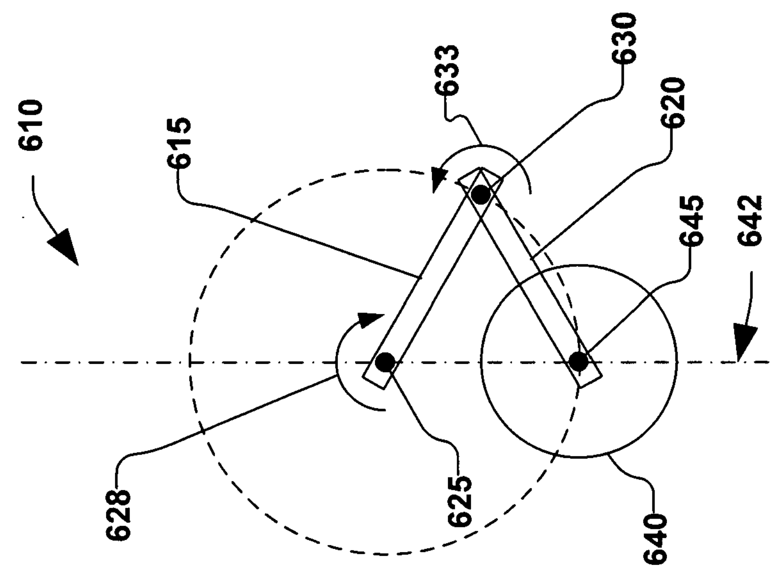
Figure 7D:
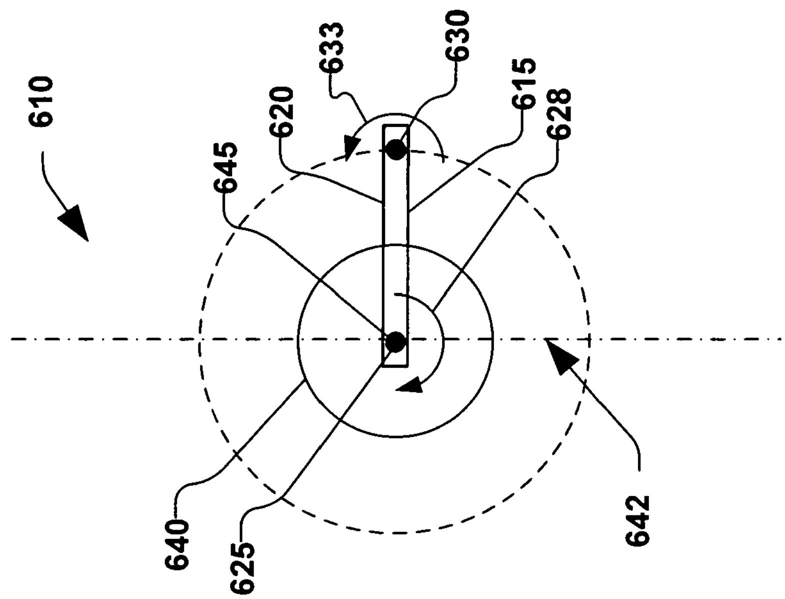
Figure 7G:
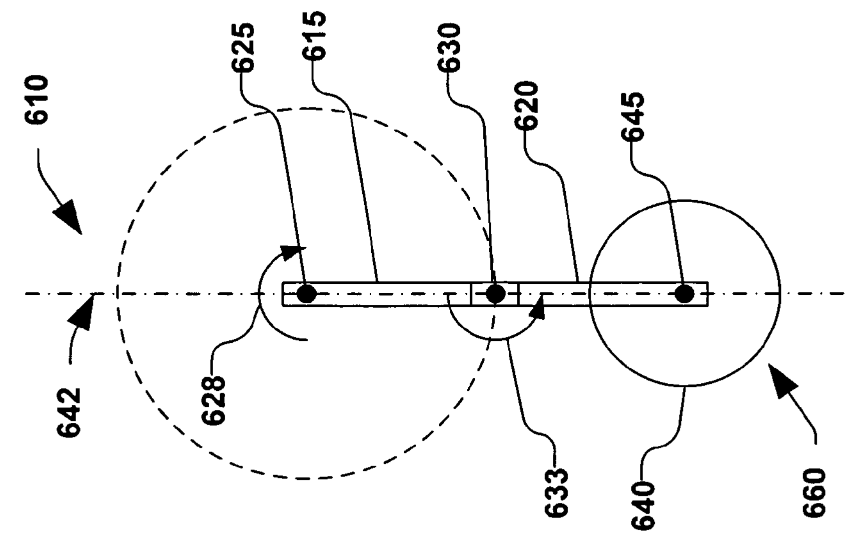
Figure 7H:
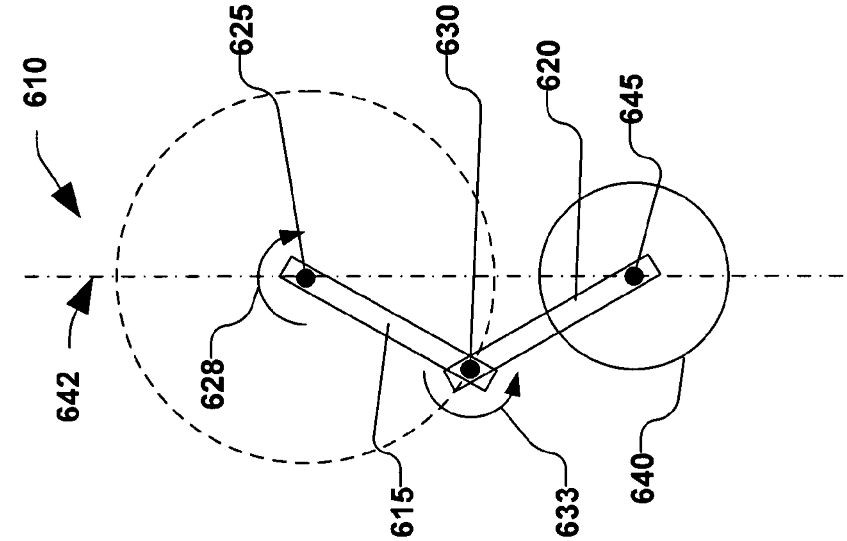
Figure 7I:
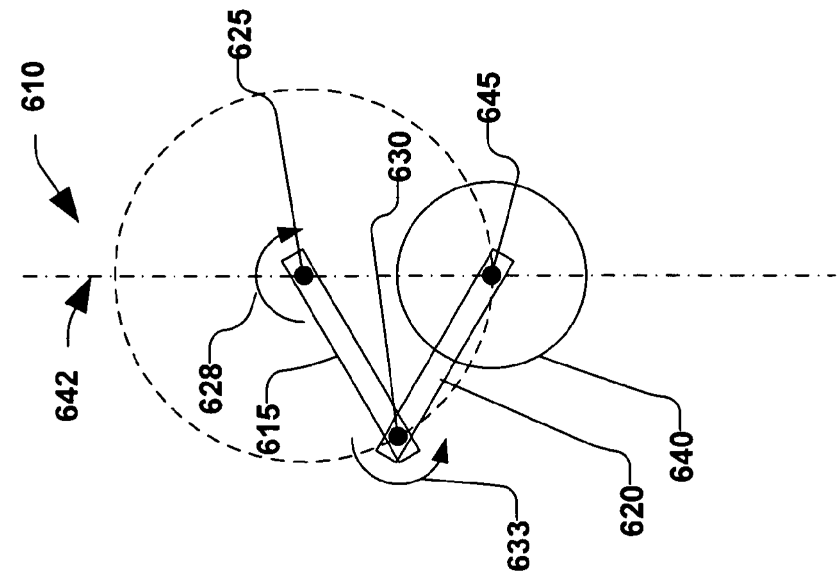
Figure 7L:
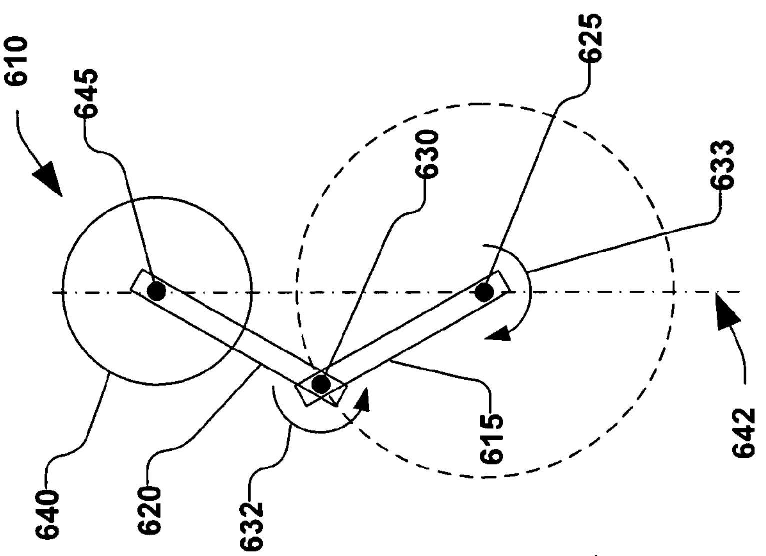
Figure 7K:
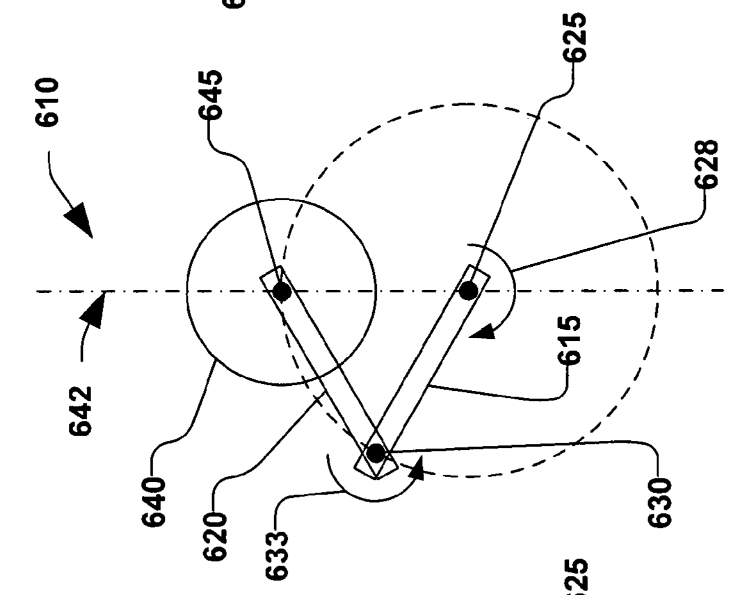
Figure 7J:
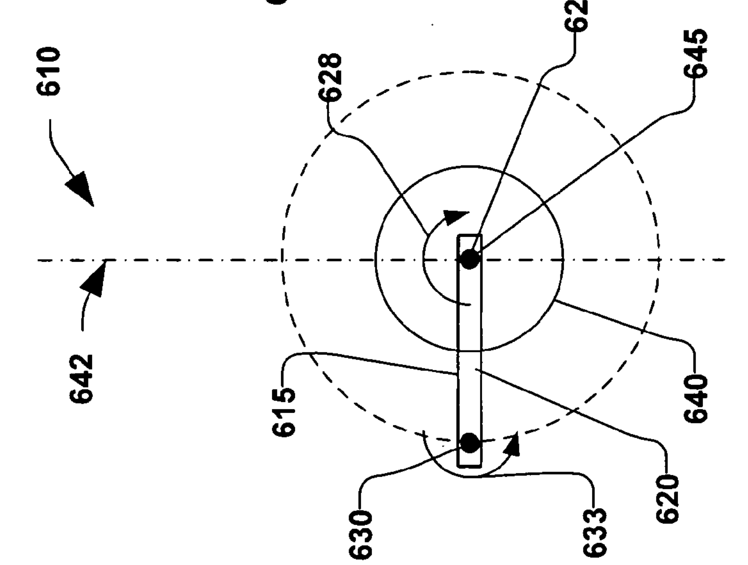

FIGS. 7A–7L illustrate the rotary subsystem 610 of FIG. 6 in various progressive positions, wherein, in the illustrated example, the first rotational direction 628 corresponds to a clockwise movement and the second rotational direction 633 corresponds to a counter-clockwise movement in the example presented. In FIG. 7A, the end effector 640 is at a first position 650 along the first scan path 642, wherein the third joint 645 is spaced a distance of approximately twice the predetermined distance L from the first joint 625, thus defining a maximum position 655 of the end effector 640. Upon a rotation of the first link 615 and second link 620 about the respective first and second joints 625 and 630 in the respective first rotational direction 628 and second rotational direction 633, as illustrated in FIGS. 7B–7L, the end effector 640 can be moved along the first scan path 642 in a generally straight-line manner. In FIG. 7G, for example, the end effector 640 is at another maximum position 660 along the first scan path 642, wherein the third joint 645 is again spaced a distance of approximately twice the predetermined distance L from the first joint 625. In FIG. 7H, for example, it should be noted that the end effector 640 is moving back toward the first position 650, while the first rotational direction 628 and second rotational direction 633 remain unchanged. Following the position illustrated in FIG. 7L, the rotary subsystem 610 is operable to move again to the first position 650 of FIG. 7A, while still maintaining the constant rotational directions 628 and 633, wherein the linear oscillation can be continued.

Figure 8:
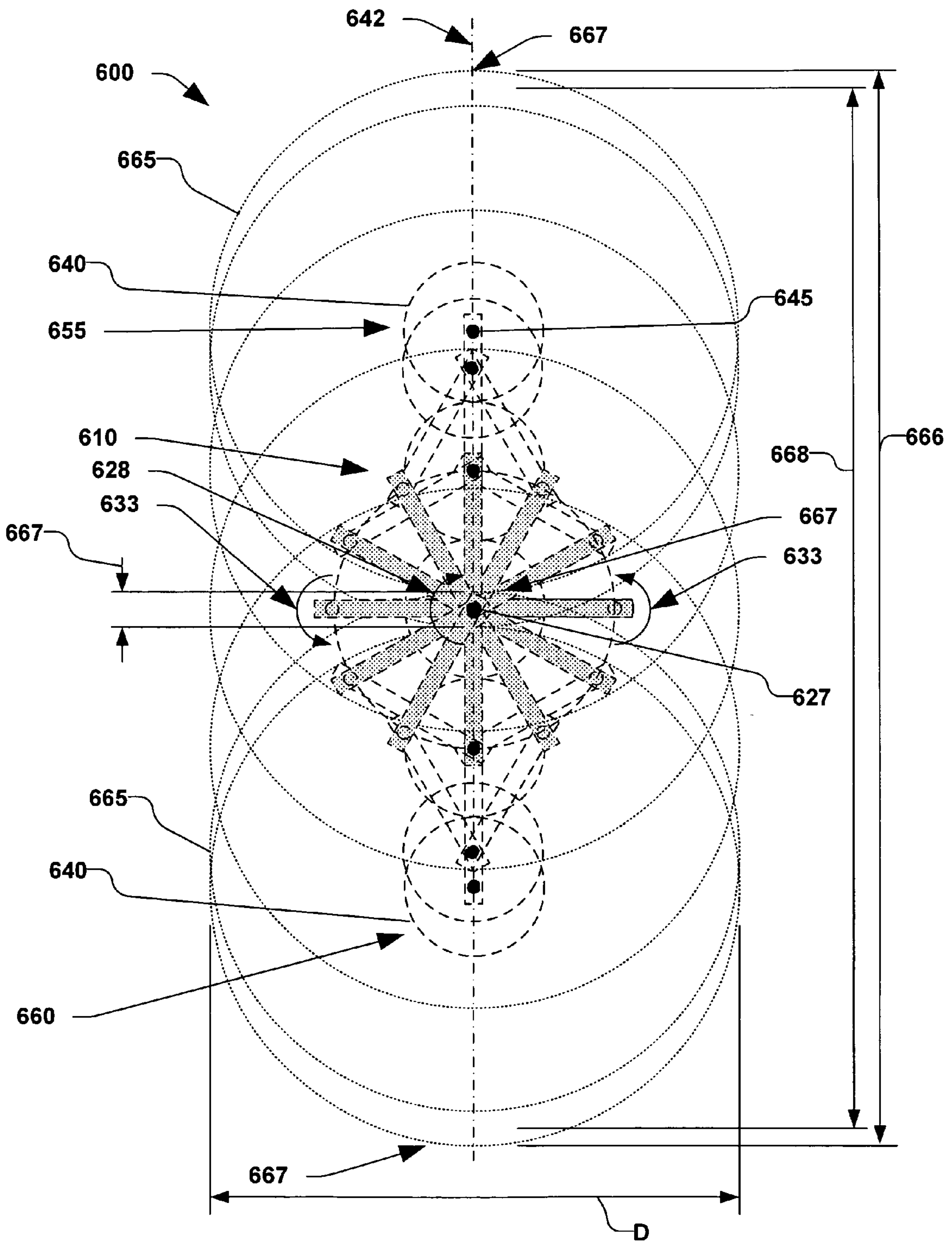
FIG. 8 is a plan view of the rotary subsystem of FIGS. 7A–7L illustrating an exemplary range of motion along a first scan path.

FIG. 8 illustrates the rotary subsystem 610 in the various positions of FIGS. 7A–7L, wherein a workpiece or substrate 665 (illustrated in phantom) further resides on the end effector 640. It should be noted that the rotary subsystem 610 is not drawn to scale, and that the end effector 640 is illustrated as substantially smaller than the substrate for purposes or clarity. An exemplary end effector 640 can be approximately the size of the substrate 665, for example, wherein adequate support for the substrate 665 can be provided. It shall be understood, however, that the end effector 640 and other features illustrated herein can be of various shapes and sizes, and that all such shapes and sizes are contemplated as falling within the scope of the present invention. As illustrated in FIG. 8, the scanning mechanism 600 is operable to linearly oscillate the substrate 665 anywhere along the first scan path 642 between maximum positions 655 and 660 of the end effector 640. A maximum scan distance 666 traveled by opposite ends 667 of the substrate 665 is associated with the maximum positions 655 and 660 of the end effector 640. In one example, the maximum scan distance 666 is slightly greater than a distance 668 equal to twice a diameter D of the substrate 665. Thus, even when a widest portion of the workpiece is being scanned back and forth across the ion beam, the workpiece or substrate 665 can "overshoot" or be moved past the ion beam slightly to accommodate inertial effects.

By way of example, a change in direction of the end effector 640 (and hence, the substrate 665) is associated with a change in velocity and acceleration of the end effector 640 and substrate 665. In ion implantation processes, for example, it is generally desirable for the end effector 640 to maintain a substantially constant velocity along the scan path 642 when the substrate 665 passes through an ion beam (not shown), such as an ion beam which is generally coincident with the first axis 627. Such a constant velocity provides for the substrate 665 to be generally evenly exposed to the ion beam throughout the movement through the ion beam. However, due to the oscillatory motion of the end effector 640, acceleration and deceleration of the end effector 640 is inevitable at either extent of the linear oscillation. Variations in velocity of the end effector 640 (e.g., during scan path turn-around) during exposure of the substrate 665 to the ion beam, for example, can lead to a non-uniform ion implantation across the substrate 665.

Therefore, a generally constant velocity is desired for respective ranges of motion that the workpiece 665 moves through as it is scanned through the ion beam along the first scan path 642. Accordingly, once the substrate 665 passes through the ion beam, the acceleration and deceleration of the end effector 640 will not substantially affect an ion implantation process or dose uniformity across the substrate 665.

Figure 9:
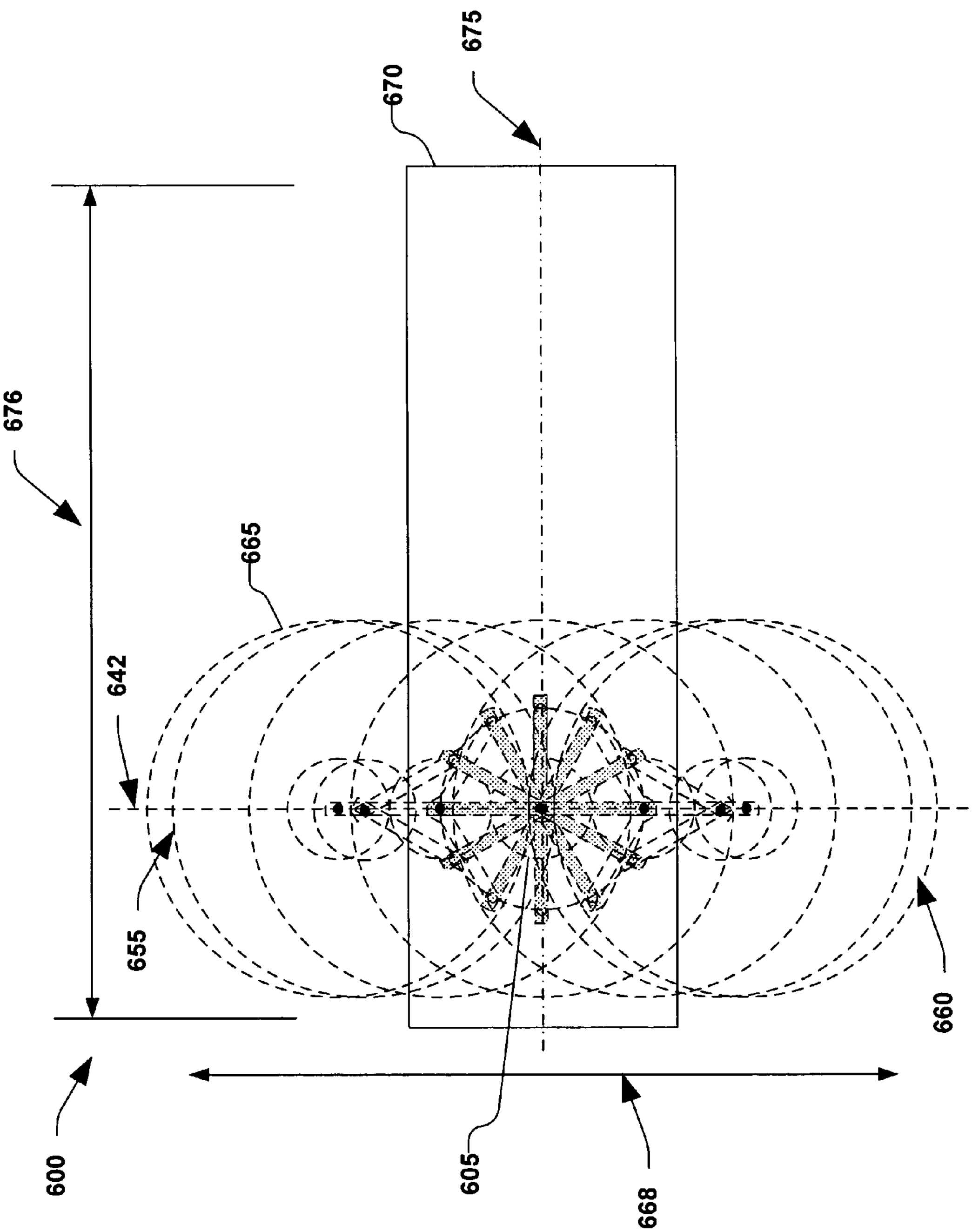
FIG. 9 is a plan view of the scanning apparatus of FIG. 6 illustrating an exemplary range of translation along a second scan path.

According to another exemplary aspect, as depicted FIG. 9, the base portion 605 of the scanning mechanism 600 is further operable to translate in one or more directions. For example, the base portion 605 is operably coupled to a translation mechanism 670, wherein the translation mechanism is operable to translate the base portion 605 and rotary subsystem 610 along a second scan path 675, wherein the second scan path 675 is substantially perpendicular to the first scan path 642. The first scan path 642 can, for example, be said to be associated with a fast scan of the substrate 665, and the second scan path 675 can be associated with a slow scan of the substrate 665, wherein, in one example, the substrate 665 can be indexed one or more increments along the second scan path 675 for every translation of the substrate 665 along the first scan path 642. A total translation 676 of the base portion 605 is, for example, approximately equal to (e.g., just greater than) twice the diameter D of the substrate 665. In this manner, the entire workpiece 665 can be implanted with ions as the workpiece 665 is moved along the slow scan path 675. The translation mechanism 670 may, for example, comprise a prismatic joint and/or a ball screw system (not shown), wherein the base portion 605 can be smoothly translated along the second scan path 675. Such a translation mechanism 670, for example, is operable to "paint" the substrate 665 residing on the end effector 640 by passing the substrate 665 through the ion beam during respective oscillations of the end effector 640 along the first scan path 642, thus uniformly implanting ions across the entire substrate 665.

It will be appreciated that the respective rotational directions 628 and 633 of the first 615 and second 620 links generally reverse prior to reaching maximum positions 655 (FIGS. 7A and 8) or 660 (FIGS. 7G and 8) when the workpiece 665 is moved in accordance with one or more aspects of the present invention. By way of example, to scan one portion of the workpiece 655, the first 615 and second 620 links may merely rotate to transition the end effector 640 (and hence the workpiece attached thereto) between the positions depicted in FIGS. 7C–7E. The first 615 and second 620 links then reverse directions to move the end effector 640 back again for an additional scan along the first scan path 642 after the translation mechanism 670 indexes the base portion 605 and rotary subsystem 610 along the second scan path 675. Oscillating the end effector 640 through less than the maximum positions depicted in FIGS. 7A and 7G as conventionally done (FIG. 1) increases throughput and conserves resources since the amount of time that the workpiece is not in "contact" with the ion beam is substantially reduced.

Further, the respective ranges that the workpiece moves through as it oscillates back and forth along the first scan path 642 may be slightly larger than the respective widths or sizes of the portions of the workpiece 665 that are scanned during the respective oscillations. In other words, there will be respective overshoots for the respective oscillatory movements of the workpiece 665 along the first scan path 642. Such respective overshoots will be generally sufficient to accommodate the acceleration and deceleration of the end effector 640 and hence the workpiece 665 attached thereto. In this manner, inertial forces experienced during scan path turn around will occur outside of the respective scanning ranges. This facilitates a more constant velocity of the end effector 640 during exposure of the substrate 665 to the ion beam and thus a more uniform ion implantation. It can thus be appreciated that it is important to know when the end of a scan has occurred (e.g., via a measurement component, such as a Faraday cup) and/or when the end of a scan is about to occur (e.g., via an awareness of the dimensions of the workpiece and/or ion beam and an updated knowledge of the relative orientation of the workpiece to the ion beam) to establish an efficient yet effective ion implantation process.

Figure 10:
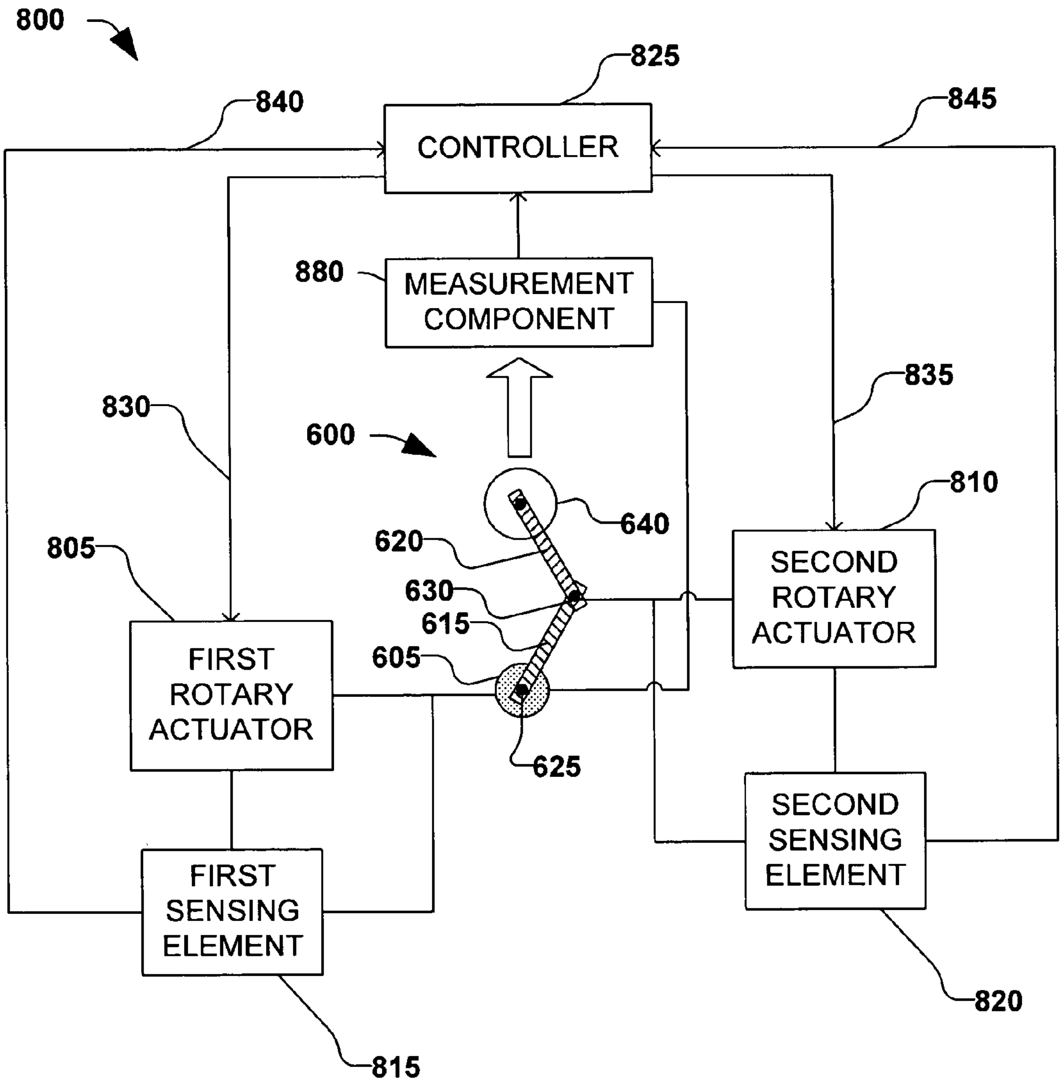
FIG. 10 is a system-level block diagram of an exemplary scanning system suitable for implementing one or more aspects of the present invention.

FIG. 10 illustrates in block diagram form a scanning system 800 suitable for implementing one or more aspects of the present invention. The scanning system 800 may, for example, correspond to the scanning system 540 included within the ion implantation system 500 depicted in FIG. 5, where at least some of the scanning apparatus 600 and component portions thereof illustrated in FIGS. 6–9 are included within the scanning system 800. A first rotary actuator 805 is, for example, associated with the first joint 625 and a second rotary actuator 810 is associated with the second joint 630 wherein the first actuator 805 and second actuator 810 are operable to provide a rotational force to the first and second links 615 and 620, respectively. For example, the first and second rotary actuators 805 and 810 comprise one or more servo motors or other rotational devices operable to rotate the respective first link 615 and second link 620 in the first rotational direction 628 and the second rotational direction 633 of FIG. 6, respectively.

The scanning system 800 of FIG. 10, for example, further comprises a first sensing element 815 and a second sensing element 820 associated with the respective first and second actuators 805 and 810, wherein the first 815 and second 820 sensing elements are further operable to sense position, or other kinematic parameters, such as velocity or acceleration, of the respective first and second links 615 and 620. Furthermore, a controller 825 (e.g., a multi-axes motion controller) is operably coupled to drivers and/or amplifiers (not shown) of the first and second rotary actuators 805 and 810 and the first and second sensing elements 815 and 820, wherein the controller 825 is operable to control an amount of power 830 and 835 (e.g., a drive signal) provided to the respective first 805 and second 810 rotary actuators for an associated control duty cycle (e.g., a movement of the end effector 640 anywhere between maximum positions 655 and 660 illustrated in FIG. 8). The first and second sensing elements 815 and 800 of FIG. 10, such as encoders or resolvers, are further operable to provide respective feedback signals 840 and 845 to the controller 825, wherein the drive signals 830 and 835 to the respective actuators 805 and 810, for example, are calculated in real-time. Such real-time calculations of the drive signals 830 and 835 generally permit a precise adjustment of the power delivered to each respective rotary actuator 805 and 810 at predetermined time increments.

The general scheme of motion control generally provides a smoothness of motion of the end effector 640, and can thus mitigate velocity errors associated therewith. According to another example, the controller 825 further comprises an inverse kinematic model (not shown), wherein the articulated motion of the end effector 640 is derived for each joint 625 and 630 at each duty cycle. For example, the position of the end effector 640 (and thus the wafer or workpiece attached thereto) can be continually ascertained or "tracked" where the size and/or other dimensional aspects of the workpiece and/or ion beam are known along with the initial orientation of the workpiece to the ion beam. The orientation of the workpiece to the beam can be updated (or even predicted), for example, as a function of movement of the first 625 and second 630 joints and/or the first 615 and second 620 links, which themselves may be ascertained from signals provided by the first 815 and second 820 sensing elements. Knowing the relative position of the workpiece to the beam allows respective lengths of travel or ranges of motion along the first scan paths 642, and thus the respective amounts of overshoot, to be controlled (e.g., to accommodate inertial effects associated with workpiece turn around). By way of example only and not limitation, the respective overshoots may fall within a range of between about 10 to about 100 millimeters. It will be appreciated, however, that the motion of the workpiece and thus the respective amounts of overshoot can also be ascertained and controlled where the size and initial orientation of the workpiece to the beam is known along with the velocity of the workpiece along the first scan path 642. Also, knowing the size of the beam and the velocity along the second scan path 675, which may, for example, be a function of beam current and/or beam intensity, allows a distance along the second scan path 675 to be determined. For example, a pencil beam having a cross-sectional diameter of between about 10 to about 100 millimeters may cause the workpiece to be moved between about 1 to about 10 millimeters, for example, along the second scan path 675 between oscillations along the first scan path 642. The controller 825, for example, may be further operable to control each actuator 805 and 810 by calculating a feed forward, model-based complimentary torque for each respective joint 625 and 630 during each control duty cycle.

As discussed in the above example, the amount of power 830 and 835 provided to the respective first and second rotary actuators 805 and 810 is based, at least in part, on the positions sensed by the respective first and second sensing elements 815 and 820. Accordingly, the position of the end effector 640 of the scanning mechanism 600 can be controlled by controlling the amount of power provided to the first and second actuators 805 and 810, wherein the amount of power is further associated with a velocity and acceleration of the end effector along the first scan path 642 of FIG. 6. The controller 825 of FIG. 10, for example, is further operable to control the translation mechanism 670 of FIG. 9, wherein the movement of the base portion 605 along the second scan path 675 can be further controlled. According to one example, an incremental motion (e.g., a "slow scan" motion) of the translation mechanism 670 is synchronized with the motion of the end effector along the first scan path 642 (e.g., a "fast scan" motion), such that the translation mechanism is incrementally moved after each pass of the substrate 665 through the ion beam (e.g., during a change of direction of the workpiece along the fast scan path).

According to one or more aspects of the present invention, a measurement component 880 is operatively coupled to the scanning system 800. The measurement component 880 facilitates detecting the end of a scan, and more particularly an "overshoot" condition at the end of a scan. For example, although not shown, the measurement component 880 may be located behind the workpiece 665 directly in line with the path of ion beam. As such, as the workpiece is moved through a respective range of motion along the first scan path 642, the beam will impinge upon the measurement component (e.g., a Faraday cup) at the end of the scan. The amount of the beam detected by the measurement component can be fed back to the controller 825, for example, which can use this data to control the motion of the workpiece (e.g., via the actuators 805, 810). For example, if the size of the workpiece is known, the controller can overshoot the workpiece a sufficient degree so that the workpiece does not encounter the ion beam while being indexed along the second scan direction 675 (FIG. 9). If the measurement component registers a decrease in the amount of the beam being detected, for example, as the workpiece is indexed along the second scan path, this may be indicative of the (round) workpiece intersecting the beam as the workpiece is indexed along the second scan path. Accordingly, the workpiece can be moved further along the first scan path so that peripheral portions of the workpiece do not become unintentionally (over) dosed as the workpiece is indexed along the second scan path. Similarly, if the measurement component 880 registers too little beam current as the direction of the workpiece is reversed to oscillate the workpiece back along the first scan path 642 (FIG. 6), or if a sufficient amount of beam current is detected, but for too little time, then this respective range of motion may be too short (e.g., the overshoot would be insufficient to accommodate the inertial effects associated with workpiece turn around, which may result in non-uniform ion implantation, particularly at peripheral or edge portions of the workpiece that lie in this scan path). Accordingly, the controller 825 can expand the respective range of motion for this particular scan to establish a sufficient, yet not wasteful or over exaggerated, overshoot. In this manner, the scan path is efficiently adjusted in real time to produce a scan pattern that resembles the size and shape of the workpiece, which facilitates uniform ion implantation.

Accordingly, one or more aspects of the present invention facilitate controlling the fast scan of the workpiece so that respective lengths of scans along the first scan path are substantially equal to or slightly greater than respective widths of portions of the workpiece being scanned during these fast scans. A scan pattern can be adjusted in real time according to one or more aspects of the present invention so that the fast scan does not extend off of the workpiece by a substantial amount. This is in contrast to conventional scanning arrangements where the relative location of workpiece to the ion beam is not known or tracked, and the workpiece is thus moved through a maximum scan distance throughout the implantation process. As such, the resulting scan pattern is "off" of the workpiece for a substantial period of time, particularly where portions other than the middle or widest portion of the workpiece are being scanned by the fast scan. It can be appreciated that scanning over "absent" or vacant areas wastes time and resources. Thus, scanning the workpiece according to one or more aspects of the present invention allows the ion implantation process to be performed in a more efficient manner. Further, the workpiece may be maneuvered so that the scan pattern extends off of the workpiece slightly upon each scan along the first scan path and remains off of the workpiece while the workpiece is moved along the second scan path in preparation for a subsequent move across the workpiece back along the first scan path. This provides respective "overshoots" that are slight, yet effective to accommodate inertial effects associated with changes in direction, velocity and/or acceleration of the workpiece. As such, an efficient yet effective ion implantation process is performed whereby the scan pattern approximates the size and shape of the wafer or workpiece being scanned.

Although the invention has been shown and described with respect to a certain preferred embodiment or embodiments, it will be appreciated that equivalent alterations and modifications may occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method of implanting ions into a workpiece by moving the workpiece through a substantially fixed ion beam, comprising:

moving the workpiece along a first scan path such that the workpiece is scanned through the ion beam; and moving the workpiece along a second scan path as the workpiece oscillates along the first scan path, wherein dimensional data regarding dimensions of the workpiece and/or the ion beam and orientation data regarding an orientation of the workpiece relative to the ion beam are utilized to produce a scan pattern of the ion beam across the workpiece that approximates the dimensions of the workpiece.

2. The method of claim 1, wherein the orientation data is updated prior to respective oscillations of the workpiece along the first scan path and is utilized to determine respective ranges of motion for the oscillations of the workpiece along the first scan path.

3. The method of claim 2, wherein the respective ranges of motion of the workpiece along the first scan path during the respective oscillations of the workpiece along the first scan path correspond to respective sizes of portions of the workpiece being scanned during the respective oscillations.

4. The method of claim 3, wherein the respective ranges of motion for the oscillations of the workpiece along the first scan path exceed the respective sizes of the portions of the workpiece being scanned during the respective oscillations of the workpiece along the first scan path by an amount sufficient to accommodate inertial effects experienced by the workpiece as the workpiece changes direction or changes velocity.

5. The method of claim 4, wherein the respective ranges exceed the respective sizes of the portions of the workpiece scanned during the respective oscillations by between about 10 to about 100 millimeters.

6. The method of claim 2, further comprising:

obtaining the dimensional data regarding dimensions of the workpiece and/or ion beam; and obtaining the orientation data regarding an orientation of the workpiece relative to the ion beam.

7. The method of claim 2, wherein the first scan path corresponds to a fast scan, the second scan path corresponds to a slow scan and the first and second scan paths are substantially normal to one another.

8. The method of claim 2, wherein the workpiece is oscillated along the first scan path at a frequency of less than about ten hertz.

9. The method of claim 2, wherein the beam is a pencil beam having a cross-sectional diameter of between about 10 to about 100 millimeters, and wherein moving the workpiece along the second scan path corresponds to moving the workpiece between about 1 to about 10 millimeters along the second scan path.

10. The method of claim 1, wherein the workpiece is oriented relative to the ion beam such that the ion beam scans across a narrowest portion of the workpiece first.

11. The method of claim 10, wherein the workpiece is substantially round and is oriented relative to the ion beam such that the ion beam scans across another narrowest portion of the workpiece last.

12. A method of implanting ions into a workpiece by moving the workpiece through a substantially stationary ion beam, comprising:

moving the workpiece along a first scan path such that the workpiece is scanned through the ion beam; and moving the workpiece along a second scan path as the workpiece oscillates along the first scan path, wherein a determination as to when to reverse the direction of the workpiece along the first scan path is based upon a sufficient amount of the ion beam being detected by a measurement component such that a scan pattern is produced that approximates the dimensions of the workpiece.

13. The method of claim 12, wherein a full intensity of the ion beam corresponds to the amount of the ion beam sufficient to cause the workpiece to reverse directions.

14. The method of claim 12, wherein the respective oscillations of the workpiece along the first scan path have respective ranges that correspond to respective sizes of portions of the workpiece being scanned during the respective oscillations of the workpiece along the first scan path.

15. The method of claim 14, wherein the respective ranges of motion for the oscillations of the workpiece along the first scan path exceed the respective sizes of the portions of the workpiece being scanned during the respective oscillations of the workpiece along the first scan path by an amount sufficient to accommodate inertial effects experienced by the workpiece as the workpiece changes direction or changes velocity.

16. The method of claim 15, wherein the respective ranges exceed the respective sizes of the portions of the workpiece scanned during the respective oscillations by between about 10 to about 100 millimeters.

17. The method of claim 12, wherein the workpiece is oriented relative to the ion beam such that the ion beam scans across a narrowest portion of the workpiece first.

18. The method of claim 12, wherein a determination is made that the entire workpiece has been scanned when a full intensity of the ion beam continues to be detected by the measurement component as the workpiece is oscillated back along the first scan path.

19. The method of claim 18, wherein the workpiece is round and is oriented relative to the ion beam such that the ion beam scans across another narrowest portion of the workpiece last.

20. The method of claim 12, wherein the first scan path corresponds to a fast scan, the second scan path corresponds to a slow scan and the first and second scan paths are substantially normal to one another.

* * * * *